United States Patent
Suwada et al.

(10) Patent No.: US 7,681,156 B2
(45) Date of Patent: Mar. 16, 2010

(54) TRANSMISSION CIRCUIT SIMULATOR AND TRANSMISSION CIRCUIT SIMULATION PROGRAM STORAGE MEDIUM

(75) Inventors: Makoto Suwada, Kawasaki (JP);
Masaki Tosaka, Kawasaki (JP);
Megumi Nagata, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 313 days.

(21) Appl. No.: 11/514,947

(22) Filed: Sep. 5, 2006

(65) Prior Publication Data

US 2007/0198957 A1 Aug. 23, 2007

(30) Foreign Application Priority Data

Feb. 23, 2006 (JP) .............................. 2006-047319

(51) Int. Cl.
*G06F 17/50* (2006.01)
(52) U.S. Cl. .................. 716/5; 716/1; 716/2; 716/3; 716/4; 716/6; 703/14; 703/17; 703/19
(58) Field of Classification Search .................. 716/1–6; 703/14, 17, 19
See application file for complete search history.

(56) References Cited

U.S. PATENT DOCUMENTS

| | | | | |
|---|---|---|---|---|
| 5,726,583 | A * | 3/1998 | Kaplinsky | 326/30 |
| 6,102,960 | A * | 8/2000 | Berman et al. | 703/17 |
| 6,591,402 | B1 * | 7/2003 | Chandra et al. | 716/5 |
| 7,120,893 | B2 * | 10/2006 | Sasaki et al. | 716/15 |
| 7,225,420 | B2 * | 5/2007 | Cress | 716/6 |
| 7,337,087 | B2 * | 2/2008 | Nagata et al. | 702/117 |
| 7,395,519 | B2 * | 7/2008 | Kawata | 716/4 |
| 2004/0068699 | A1 * | 4/2004 | Morris et al. | 716/4 |
| 2005/0278160 | A1 * | 12/2005 | Donnelly et al. | 703/19 |

FOREIGN PATENT DOCUMENTS

JP 2000-331043 11/2000
JP 2002-197132 7/2002

OTHER PUBLICATIONS

Zhang et al.; "Improvements in the realization of a real-time digital simulator of a power transmission line"; Sep. 17-20, 1991; AC and DC Power Transmission, 1991., International Conference on; pp. 356-361.*

* cited by examiner

*Primary Examiner*—Helen Rossoshek
(74) *Attorney, Agent, or Firm*—Fujitsu Patent Center

(57) ABSTRACT

A circuit simulator includes: a DC analysis section which analyses a static stable potential on a transmission circuit if a capacitor which blocks a DC current while allowing an AC current to pass therethrough is connected in series in the line of the transmission circuit; and an initial potential application section which applies, as an initial potential in the simulation, the stable potential obtained by the DC analysis section to an application position on the upstream side of the capacitor in the flow of the signal through the transmission circuit. The simulator also includes a circuit simulation section which performs the simulation of the transmission circuit under the initial potential applied by the initial potential application section.

6 Claims, 10 Drawing Sheets

TRANSMISSION CIRCUIT SIMULATOR AND TRANSMISSION CIRCUIT SIMULATION PROGRAM STORAGE MEDIUM

BACKGROUND OF THE INVENTION

1. Field of the Invention

The present invention relates to a circuit simulator for performing a simulation of signal transmission in a transmission circuit in which a drive circuit which transmits a signal and a receiver circuit which receives the signal are connected to each other by a line, and to a circuit simulation program storage medium on which a circuit simulation program for enabling a computer to operate as the circuit simulator is stored.

2. Description of the Related Art

In the field of circuit designing, a circuit simulator for performing a simulation of a designed circuit on a computer before the circuit is actually manufactured is being used widely (see, for example, Japanese Patent Laid-Open Nos. 2000-331043 and 2002-197132). In the process of designing and manufacturing a transmission circuit in which a drive circuit which transmits a signal and a receiver circuit which receives the signal are connected to each other by a line, it is important to check the state of transmission of the signal before actually manufacturing the circuit. The circuit simulator is also used to check the state of transmission in such a case. Transient analysis for analyzing temporal changes of a signal on a line is ordinarily performed in a simulation of such a transmission circuit.

In some case of designing of a transmission circuit such as that described above, a technique is adopted to couple the driver circuit and the receiver circuit to each other by a line in which an AC coupling component such as a capacitor capable of blocking a DC current while allowing an AC current to pass therethrough is connected in series at an intermediate position in the line, for example, if a DC potential difference exists between the output end of the driver circuit and the input end of the receiver circuit.

FIG. 10 is a diagram showing a circuit model representing an example of a transmission circuit using a capacitor as an AC coupling component.

The transmission circuit represented by a circuit model 500 in FIG. 10 is a differential signal transmitting type of transmission circuit suitable for high-speed signal transmission.

The circuit model 500 shown in FIG. 10 has a device model 510 (hereinafter referred to as "driver model") representing a drive circuit which transmits a signal, and a device model 520 (hereinafter referred to as "receiver model") representing a receiver circuit which receives the signal. The two device models 510 and 520 are coupled to each other by two line models 530 and 540 respectively representing two lines. One of the two lines will be referred to as a Pos line, and the other of the two lines will be referred to as a Neg line. The line model representing the Pos line will be referred to as Pos line model 530, and the line model representing the Neg line will be referred to as Neg line model 540. In the transmission circuit represented by the circuit model 500, a signal is transmitted as a potential difference between the Pos line and the Neg line. The Pos line model 530 and the Neg line model 540 is a differential line model formed by also considering the coupling between the lines.

In the transmission circuit represented by the circuit model 500, a capacitor is connected in series as an AC coupling component in each of the Pos line and the Neg line. Accordingly, the Pos line model 530 is constituted by a pattern model 531 representing the pattern from the driver circuit to the capacitor, a device model 550 representing the capacitor (hereinafter referred to as "capacitor model"), and a pattern model 532 representing the pattern from the capacitor to the receiver circuit. Similarly, the Neg line model 540 is constituted by a pattern model 541 representing the pattern from the driver circuit to the capacitor, a capacitor model 550, and a pattern model 542 representing the pattern from the capacitor to the receiver circuit.

In this circuit model 500, an electrical direct connection is established between each adjacent pair of device models.

In the transmission circuit represented by the circuit model 500, a signal transmitted by the driver circuit is sent to the receiver circuit on the lines while any DC current is blocked.

In a transmission circuit having a capacitor as an AC coupling component for example, signal transmission is performed in a steady state in which the capacitor is sufficiently charged and stable in the charged state. However, if such a steady state is simulated by transient analysis, the time required for simulation by computation is considerably long. If analysis results are output before the transmission circuit enters the steady state, they indicate only a state during transition to the steady state, and differ from the actual signal transmission results.

FIG. 11 is a diagram showing analysis results of transient analysis before the steady state.

Part (A) of FIG. 11 is a Waveform showing changes in the potential on the Pos line model 530 and the potential on the Neg line model 540 during signal transmission. Part (B) of FIG. 11 is a Waveform showing changes in the differential potential, i.e., the difference between the potential on the Pos line model 530 and the potential on the Neg line model 540.

In the actual transmission circuit, signal transmission is performed in a stable state such that the maximum potential on the Pos line is substantially equal to that on the Neg line, and the minimum potential on the Pos line is substantially equal to that on the Neg line. As a result, the differential potential changes up and down about 0 V.

The analysis results shown in FIG. 11, however, are from a halfway state before the circuit model 500 enters the steady state. Line P1 indicating the change in the potential on the Pos line model 530 is on the high-potential side (the upper section in the Waveform) with respect to line N1 indicating the change in the potential on the Neg line model 540, as shown in part (A). Line D1 indicating the change in differential potential changes up and down about a potential of 300 mV much higher than 0 V, as shown in part (B).

With the lapse of the analysis time, the potential on the Pos line model 530, the potential on the Neg line model 540 and the differential potential in the simulation become closer to the values in the actual signal transmission. However, a long analysis time is required to obtain the desirable results, as described.

For transient analysis in a transmission circuit using an AC coupling component such as that described above, a method is conventionally adopted in which a suitable potential for enabling a circuit model representing the transmission circuit to reach a steady state in a reduced time period is given to the circuit model as an initial value in transient analysis in advance. However, a certain level of skill is required to obtain and give a suitable initial value.

SUMMARY OF THE INVENTION

The present invention has been made in view of the above circumstances and provides a circuit simulator capable of easily executing a simulation of a transmission circuit in a reduced time period, and a circuit simulation program storage medium on which a circuit simulation program for enabling a computer to operate as such a circuit simulator is stored.

The present invention provides a circuit simulator which performs a simulation of a transmission circuit in which a driver circuit which transmits a signal and a receiver circuit which receives the signal are coupled to each other by a line, the circuit simulator including:

a DC analysis section which analyses a static stable potential on the line if an AC coupling component which blocks a DC current while allowing an AC current to pass therethrough is connected in series in the line;

an initial potential application section which applies, as an initial potential in the simulation, the stable potential obtained by the DC analysis section to an application position on the driver circuit side from the AC coupling component in a flow of the signal through the transmission circuit; and a simulation section which performs the simulation of the transmission circuit under the initial potential applied by the initial potential application section.

In the circuit simulator of the present invention, a simulation of a transmission circuit having an AC coupling component is executed in a state where the stable potential is applied, that is, in a state where the transmission circuit has entered a substantially steady state, and the state of the transmission circuit is promptly changed into a steady state in the simulation. Therefore, the time required for simulation of the transmission circuit can be reduced. Also, in the circuit simulator of the present invention, a stable potential for enabling the simulation in a reduced time period as described above is analytically obtained by the DC analysis section. Therefore, even an inexperienced person can easily perform the simulation of signal transmission. Analysis in the DC analysis section can be performed only for the purpose of obtaining a static stable potential. Therefore, restricted analysis in which a condition suitable for this purpose is set with respect to the transmission circuit may suffice. For this reason, a stable potential can be obtained in a time period much shorter than that required in transient analysis or the like on a transmission circuit under an arbitrary condition. Therefore, even if the analysis time in the DC analysis section is included, the simulation of the transmission circuit requires a shorter time. That is, the circuit simulator of the present invention is capable of easily executing a simulation of a transmission circuit while limiting the analysis time.

In the circuit simulator of the present invention, it is preferable that "the initial potential application section applies the initial potential to the application position by inserting at the application position a temporary device which first outputs the initial potential, and which thereafter behaves as a simple conductor."

In the circuit simulator in this preferred form, the initial potential can be applied to the transmission circuit without making any change in the electrical characteristics of the transmission circuit during simulation.

The circuit simulator of the present invention may be formed such that "the initial potential application section applies the initial potential to a predetermined position on the line set as the application position" or such that "the initial potential application section applies the initial potential to a position in the driver circuit set as the application position."

The circuit simulator in such a form can reliably set the line in the transmission circuit in a statically stable potential state.

The present invention also provides a simulation program storage medium that stores a circuit simulation program which is incorporated in a computer, and which enables the computer to operate as a circuit simulator performing a simulation of a transmission circuit where a driver circuit that transmits a signal and a receiver circuit that receives the signal are coupled to each other by a line, the circuit simulation program implementing:

a DC analysis section which analyses a static stable potential on the line if an AC coupling component which blocks a DC current while allowing an AC current to pass therethrough is connected in series in the line;

an initial potential application section which applies, as an initial potential in the simulation, the stable potential obtained by the DC analysis section to an application position on the driver circuit side from the AC coupling component in a flow of the signal through the transmission circuit; and a circuit simulation section which performs the simulation of the transmission circuit under the initial potential applied by the initial potential application section.

The circuit simulation program of the present invention ensures that the circuit simulator of the present invention is easily constructed on a computer.

Only the basic form of the circuit simulation program storage medium of the present invention is described here. This simplification of description is only for avoiding redundancy. The circuit simulation program storage medium of the present invention includes various forms corresponding to the forms of the circuit simulator as well as the basic forms.

The components including the DC analysis section constructed on a computer by the circuit simulation program of the present invention may be such that one component is formed by one program part; one component is formed by plural program parts; or plural components are formed by one program part. These components may be constructed so as to perform the corresponding functions by themselves or execute the functions by providing instructions to a different program or program parts incorporated in the computer.

According to the present invention, as described above, a simulation of a transmission circuit can be easily executed while limiting the analysis time.

DETAILED DESCRIPTION OF THE INVENTION

An embodiment of the present invention will be described with reference to the accompanying drawings.

Figure 1:
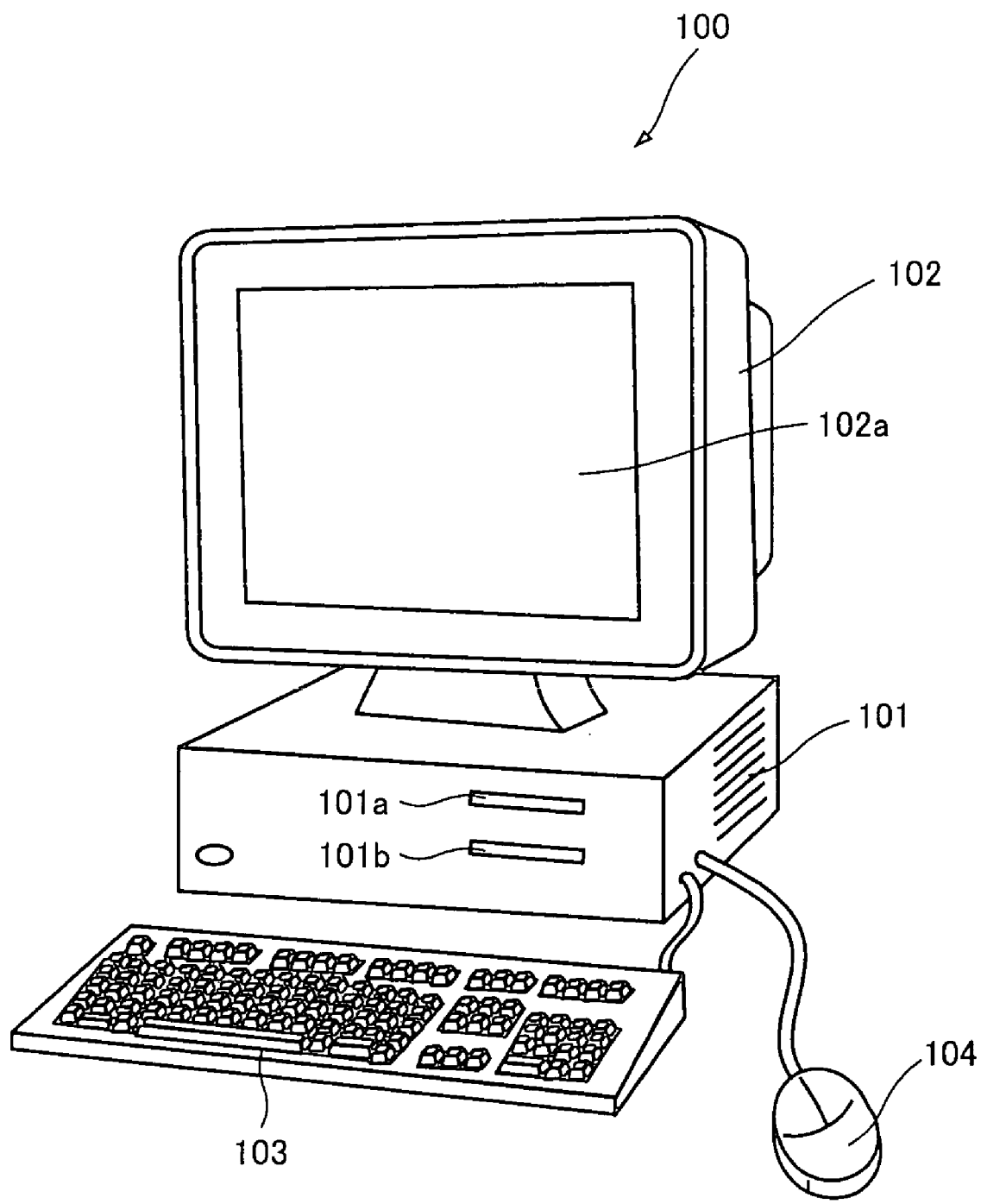
FIG. 1 is an external perspective view of a computer which operates as an embodiment of the circuit simulator of the present invention.
Figure 2:
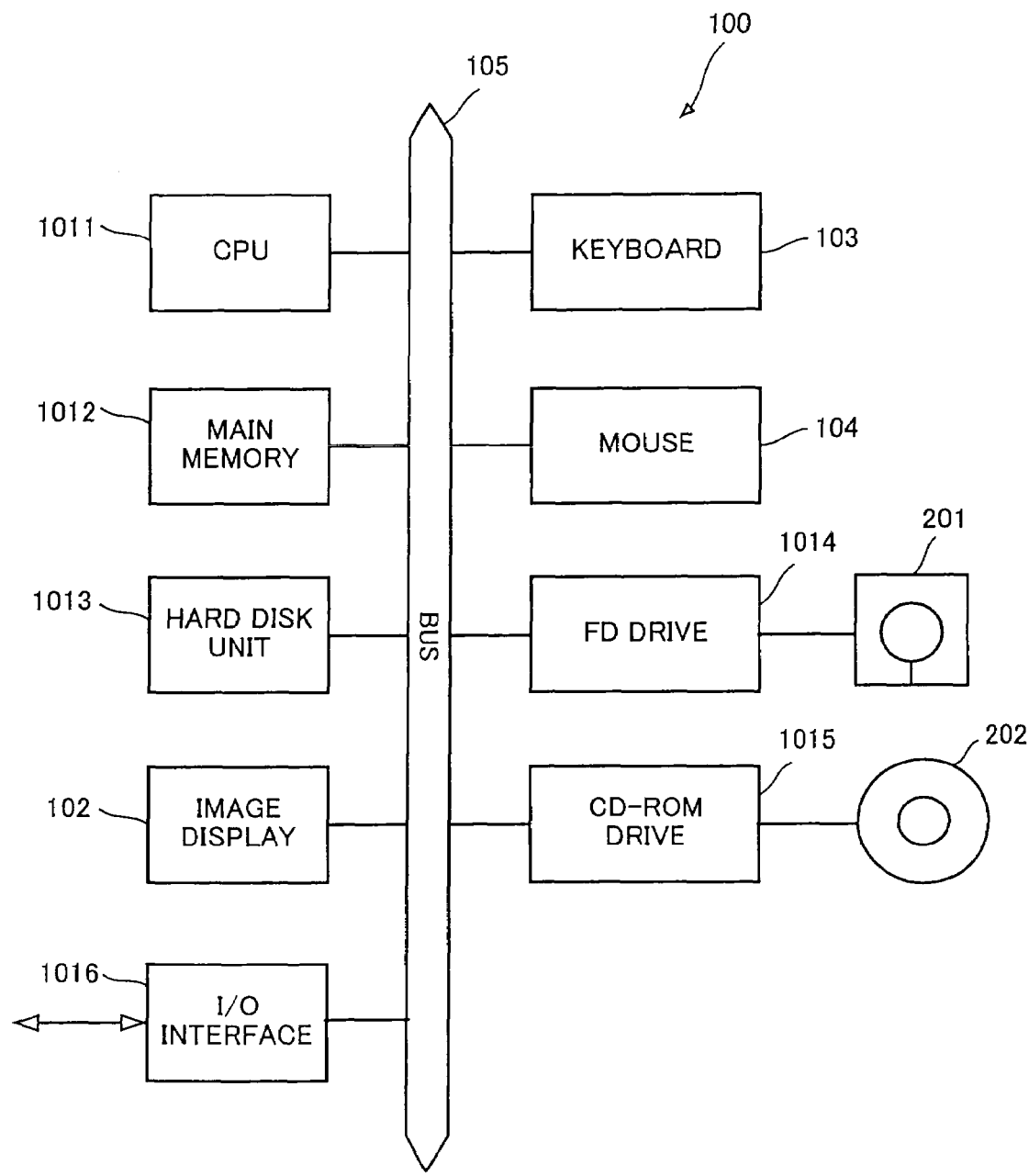
FIG. 2 is a diagram showing the configuration of the hardware of the computer.

FIG. 1 is an external perspective view of a computer 100 which operates as an embodiment of the circuit simulator of the present invention. FIG. 2 is a diagram showing the configuration of the computer 100.

As shown in FIG. 1, the computer 100 has, as its components seen in its appearance, a main unit 101, an image display 102 which displays an image on a display screen 102a according to a command from the main unit 101, a keyboard 103 which inputs various kinds of information to the main unit 101 according to key operations, and a mouse 104 which inputs to the main unit 101 a command, for example, according to an icon or the like indicated at an arbitrary position designated on the display screen 102a. The main unit 101 has an FD loading port 101a for loading a flexible disk (FD) and a CD-ROM loading port 101b for loading a CD-ROM.

In the main unit 101 are provided, as shown in FIG. 2, a CPU 1011 which executes various programs, a main memory 1012 into which a program stored in a hard disk unit 1013 is read and loaded for execution by the CPU 1011, the hard disk unit 1013 in which various programs, data and the like are stored, an FD drive 1014 into which an FD 201 is loaded, and in which the loaded FD 201 is accessed, a CD-ROM drive 1015 into which a CD-ROM 202, a CD-R or the like is loaded, and in which the loaded CD-ROM 202 or the like is accessed, and an I/O interface 1016 for exchange of signals with an external device (not shown). These various components, the image display 102, the keyboard 103 and the mouse 104 are connected to each other through a bus 105.

The CD-ROM 202 is an embodiment of the circuit simulation program storage medium of the present invention on which a circuit simulation program for enabling the computer 100 to operate as an embodiment of the circuit simulator of the present invention is stored. The program stored on the CD-ROM 202 is uploaded by the computer 100 to be stored on the hard disk unit 1013. The computer 100 operates as an embodiment of the circuit simulator of the present invention by executing the program.

Description will next be made of an embodiment of the circuit simulation program of the present invention.

Figure 3:
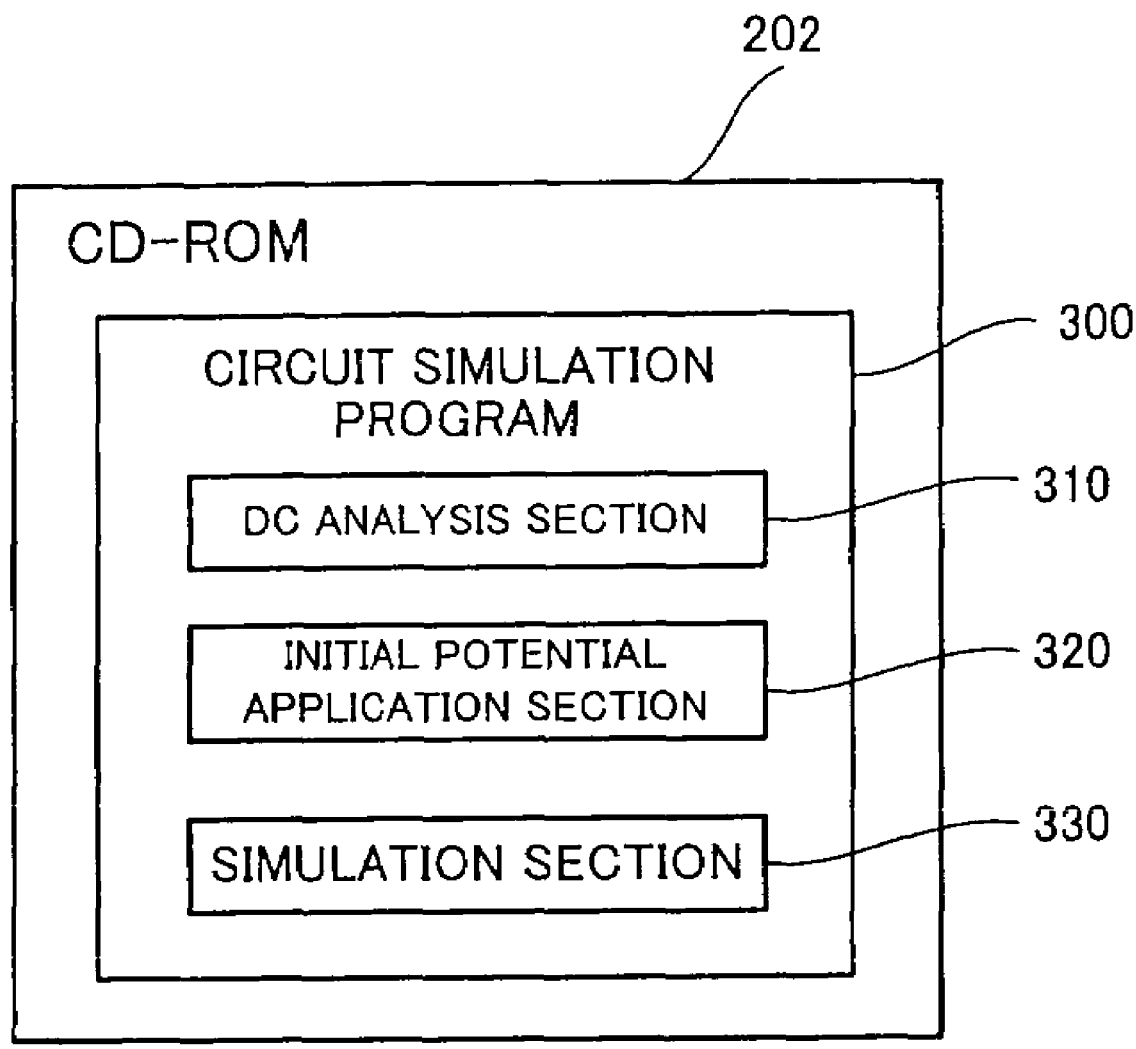
FIG. 3 is a diagram schematically showing a CD-ROM which is an embodiment of the circuit simulation program storage medium of the present invention.

FIG. 3 is a diagram schematically showing a CD-ROM which is an embodiment of the circuit simulation program storage medium of the present invention.

FIG. 3 is a diagram schematically showing the CD-ROM 202 on which a circuit simulation program 300 corresponding to the circuit simulation program of the present invention is stored.

The circuit simulation program 300 enables the computer 100 to operate as an embodiment of the circuit simulator of the present invention, and has a DC analysis section 310, an initial potential application section 320 and a simulation section 330. Details of these components of the circuit simulation program 300 will be described later.

Figure 4:
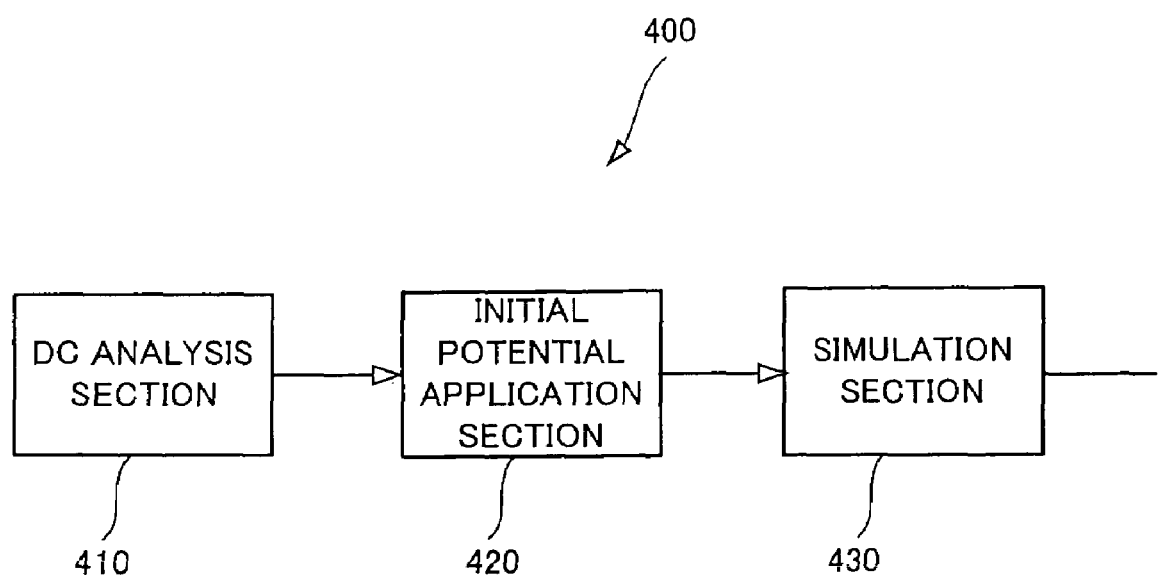
FIG. 4 is a block diagram showing an embodiment of the circuit simulator of the present invention.

FIG. 4 is a block diagram showing an embodiment of the circuit simulator of the present invention.

A circuit simulator 400 shown in FIG. 4 as an embodiment of the circuit simulator of the present invention is formed when the simulation program 300 shown in FIG. 3 is installed and executed on the computer 100 shown in FIG. 1. The circuit simulator 400 has a DC analysis section 410, an initial potential application section 420 and a simulation section 430.

When the simulation program 300 shown in FIG. 3 is installed on the computer 100 shown in FIG. 1, the DC analysis section 310, the initial potential application section 320 and the simulation section 330 of the simulation program 300 form the DC analysis section 410, the initial potential application section 420 and the simulation section 430, respectively, of the circuit simulator 400 shown in FIG. 4. While these components of the circuit simulator 400 are formed by the combination of the hardware of the computer and an operating system (OS) and an application program executed on the computer, the components of the circuit simulation program 300 shown in FIG. 3 are formed only by the application program.

The DC analysis section 410, the initial potential application section 420 and the simulation section 430 in the circuit simulator 400 respectively correspond to examples of the DC analysis section, the initial potential application section and the simulation section in the circuit simulator of the present invention.

Description will be made of the components of the circuit simulator 400 shown in FIG. 4 as well as of the components of the circuit simulation program 300 shown in FIG. 3.

In the process of performing a simulation of a transmission circuit by the circuit simulator 400, a circuit model representing the transmission circuit to be simulated is first input to the circuit simulator 400.

In the circuit simulator 400 shown in FIG. 4, a static stable potential is obtained by the DC analysis section 410 with respect to the input circuit model. The static stable potential is then given to the circuit model as the initial potential by the initial potential application section 420, and a simulation is executed under the initial potential by the simulation section 430.

The flow of simulation in the circuit simulator 400 will be described in detail below. In the following description, a reference is made to the components shown in FIG. 4 without particularly referring to the figure number.

Figure 5:
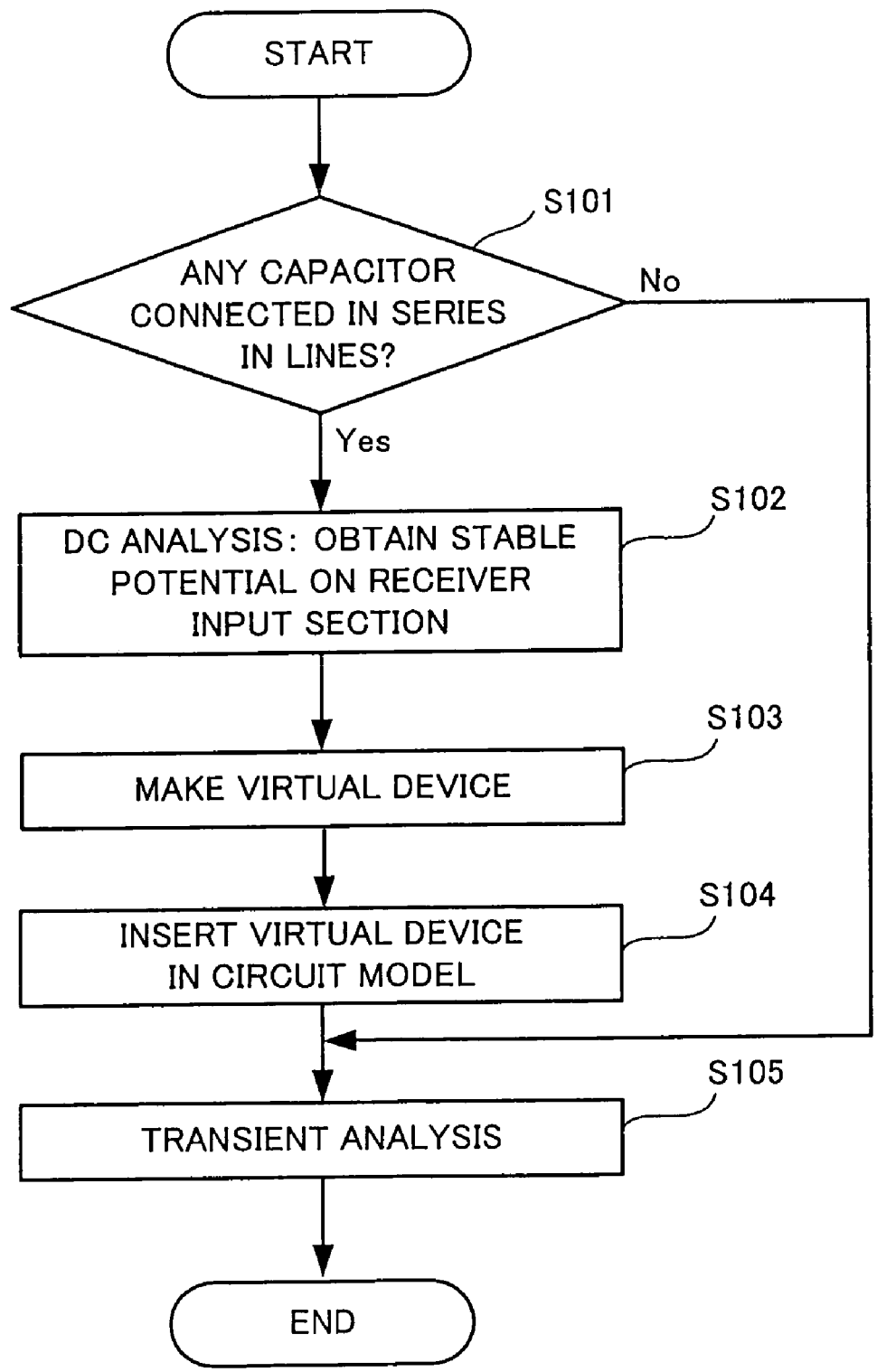
FIG. 5 is a flowchart showing the flow of simulation in a circuit simulator 400 shown in FIG. 4.

FIG. 5 is a flowchart showing the flow of simulation in the circuit simulator 400 shown in FIG. 4.

Figure 10:
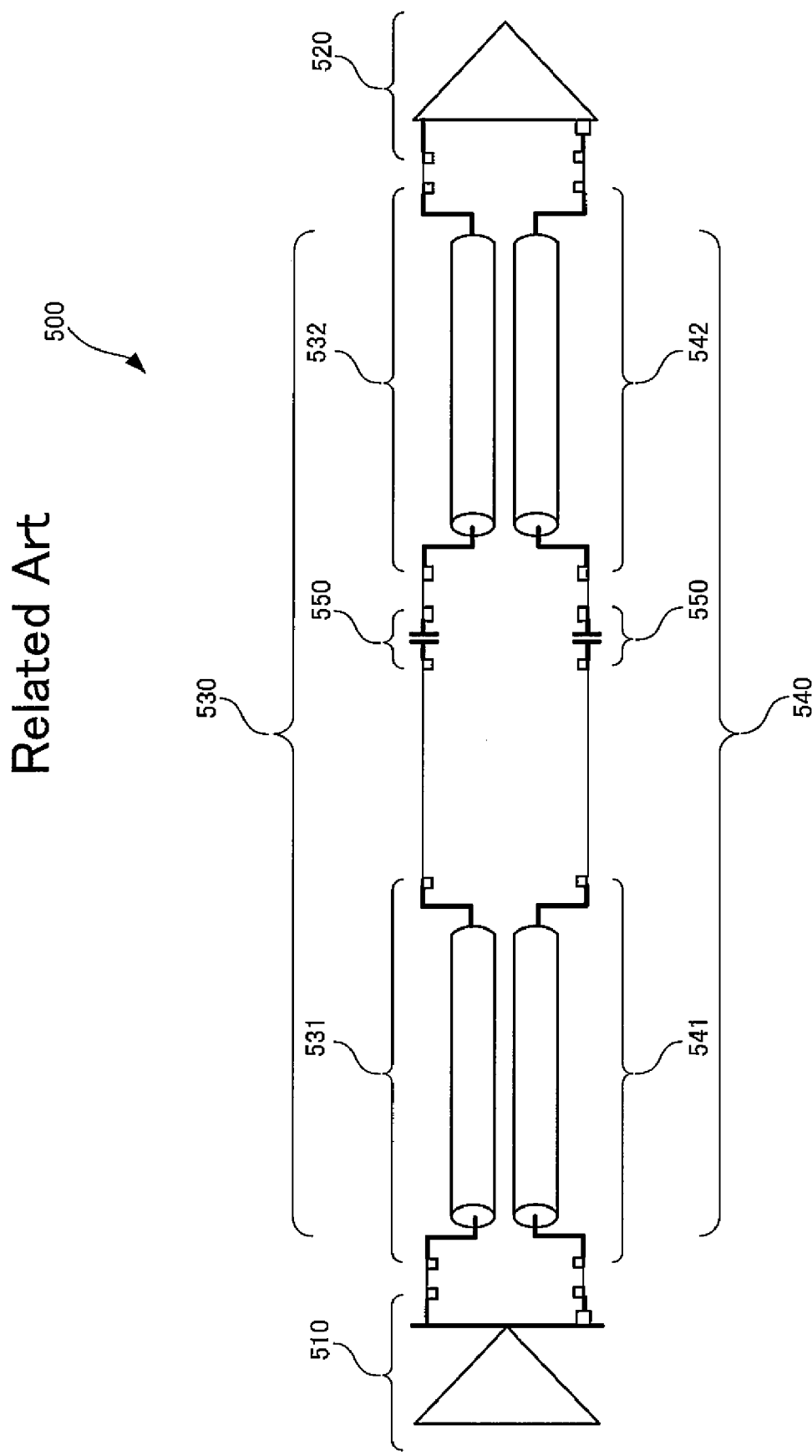
FIG. 10 is a diagram showing a circuit model representing an example of a transmission circuit using a capacitor as an AC coupling component.
Figure 11:
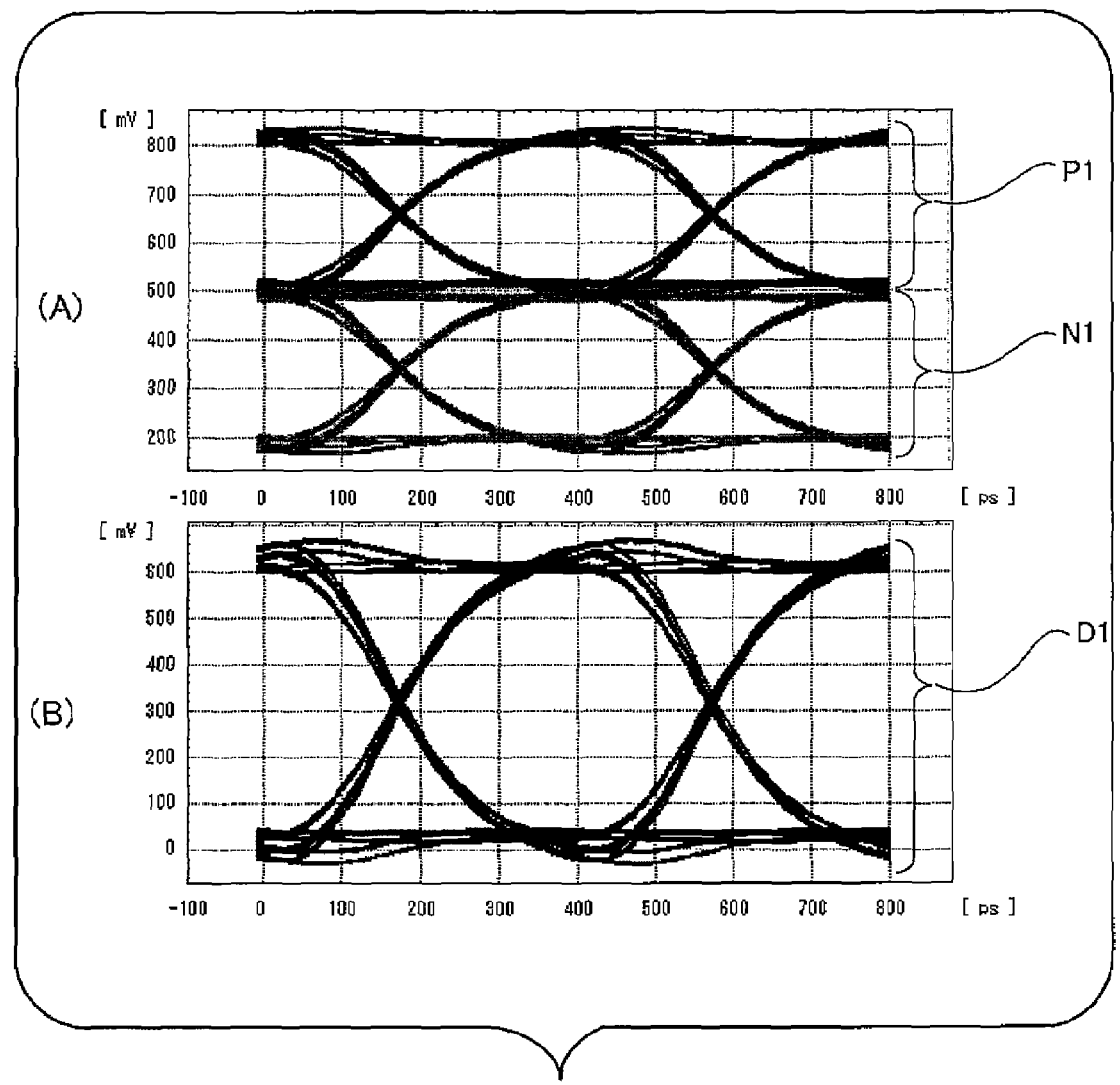
FIG. 11 is a diagram showing the analysis results of transient analysis before a steady state.

The simulation shown in the flowchart is started when a circuit model such as shown in FIG. 10 is input to the circuit simulator 400 and when an operator inputs a command through a command screen (not shown) to start the simulation. Determination is first made in the DC analysis section 410 when processing is started as to whether or not a capacitor is connected in series in the lines in the circuit model (step S101).

If it is determined in processing in step S101 that no capacitor is connected in series in the lines (determination of No in step S101), transient analysis in step S105 is executed. After the completion of transient analysis, the process shown in FIG. 5 ends. Description will be made later of transient analysis in step S105.

If it is determined in processing in step S101 that a capacitor is connected in series in the lines (determination of Yes in step S101), processing described below is executed.

The following description will be made by assuming that the circuit model 500 shown in FIG. 10 is input to the circuit simulator 400. Since a capacitor is connected in series in the lines in the circuit model 500, it is determined by processing in step S101 that a capacitor is connected in series in the lines. In the following description, a reference is also made to the components shown in FIG. 10 without particularly referring to the figure number.

In this case, DC analysis is executed by computing potentials in the circuit model 500 on the assumption that the transmission circuit is statically stabilized (step S102) In this embodiment, static stable potentials on the input section are obtained with respect to the two lines in the receiver model 520 by this DC analysis.

A model of a temporary device described below is made by the initial potential application section 420 on the basis of the stable potentials obtained in step S102 (step S103), and the temporary device model thus made is inserted in the circuit model 500 (step S104).

Figure 6:
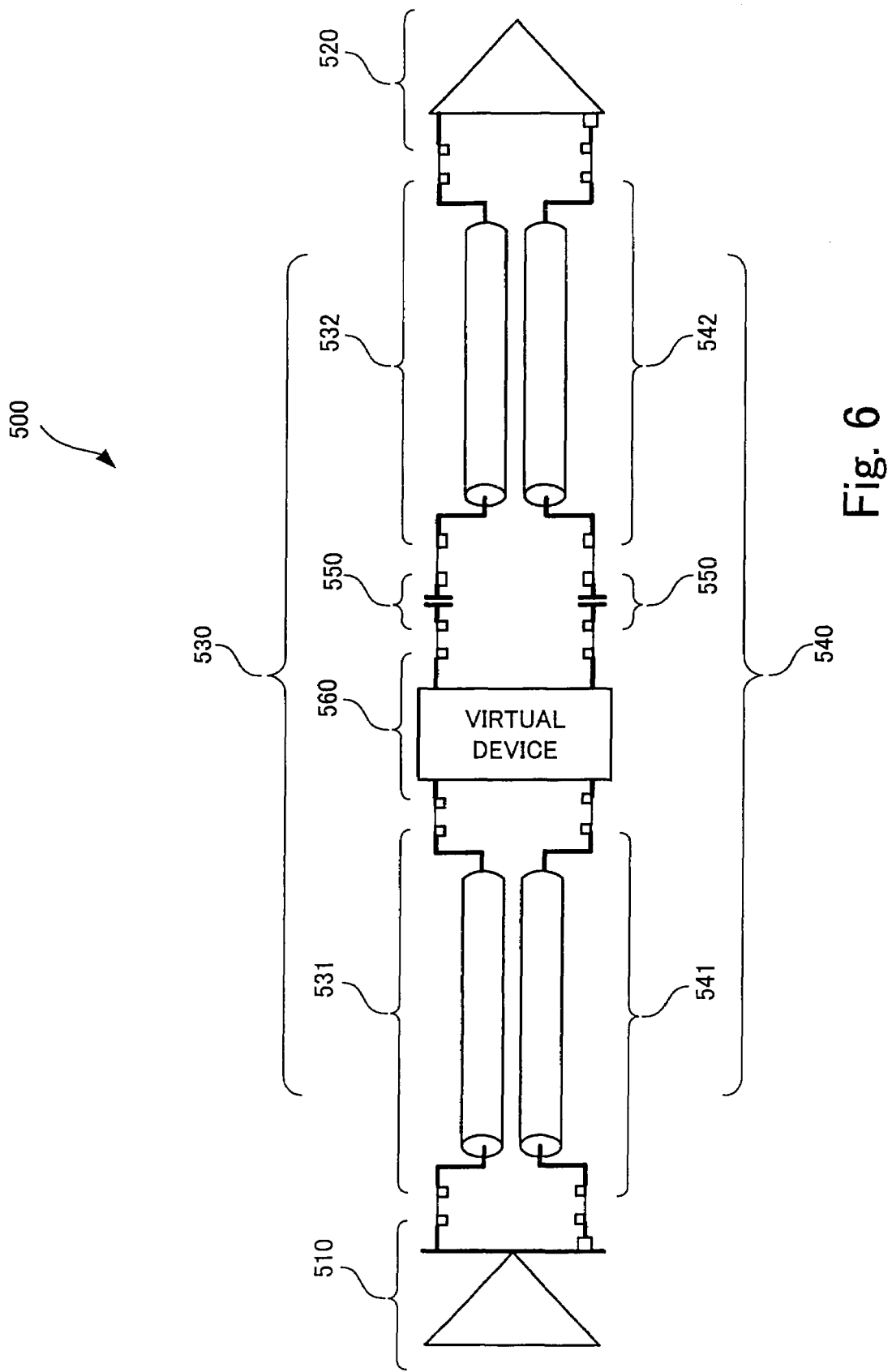
FIG. 6 is a diagram showing a state in which a model of a temporary device based on DC analysis is inserted in a circuit model 500 shown in FIG. 10.

FIG. 6 is a diagram showing a state in which a model of a temporary device based on DC analysis is inserted in the circuit model 500 shown in FIG. 10.

The temporary device model 560 shown in FIG. 6 represents a temporary device which outputs the stable potentials to the Pos line model 530 and the Neg line model 540 at the beginning of the operation of the circuit model 500, and which thereafter behaves as a simple conductor. This temporary device corresponds to the temporary device in accordance with the present invention.

In step S104 shown in FIG. 5, the initial potential application section 420 inserts this temporary model device 500 immediately before the capacitor models 550 in the Pos line model 530 and the Neg line model 540, as shown in FIG. 6. The position immediately before the capacitor models 550 corresponds to an example of the application position in accordance with the present invention.

By the insertion of this temporary device model 560 in transient analysis executed in step S105, the state of the circuit model 500 is promptly changed into a steady state in which the capacitor model 550 is sufficiently charged.

In this embodiment, the place in which the temporary device model 560 is inserted is specified on the program as a position immediately before each of the capacitor models in the Pos line model and the Neg line model in the circuit model of the transmission circuit (circuit model 500 in this embodiment). However, the present invention is not limited to this. For example, the place in which the temporary device model 560 is inserted may be in the driver model in the circuit model of the transmission circuit, as described below.

Description will be made of an example of a case where an internal portion of the driver model in the circuit model of the transmission circuit is specified on the program as the place in which the temporary device model 560 is inserted.

Figure 7:
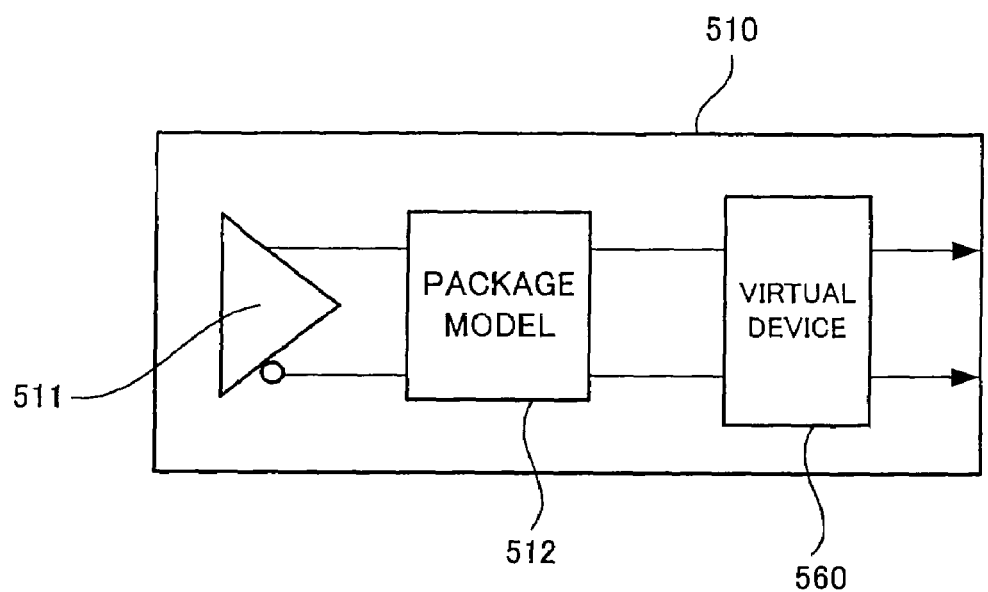
FIG. 7 is a diagram showing a state in which a temporary device model 560 is inserted in a driver model 510 in the circuit model 500.

FIG. 7 is a diagram showing a state in which the temporary device model 560 is inserted in the driver model 510 in the circuit model 500.

The driver model 510 is constituted by a die model 511 expressing electrical characteristics of the driver circuit and a package model 512 expressing the shape of the driver circuit. In the state shown in FIG. 7, the temporary device model 560 inserted in the driver model 510 is placed in a stage following the package model 512.

Figure 8:
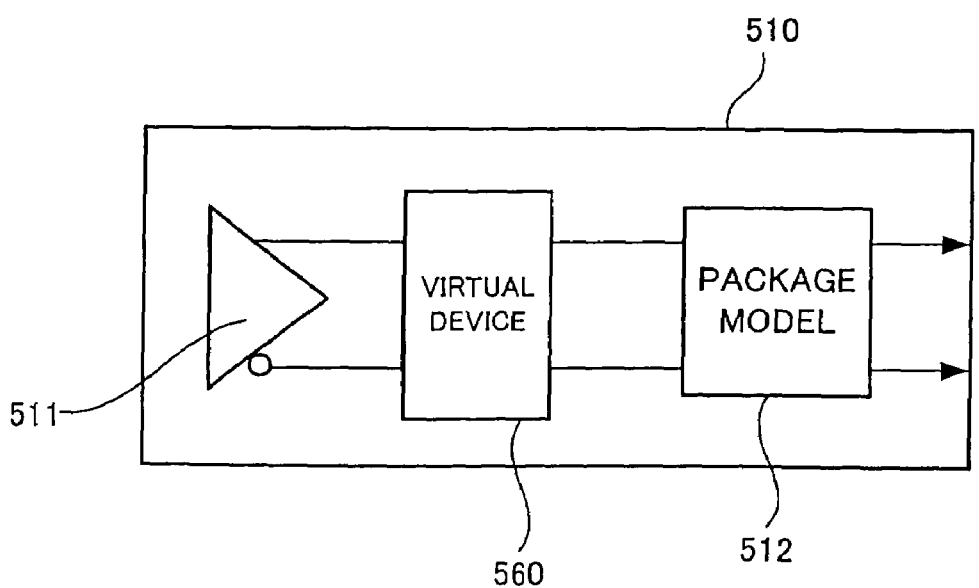
FIG. 8 is a diagram showing a state in which a temporary device model 560 is inserted in the driver model 510 in the circuit model 500, and which is different from that shown in FIG. 7.

FIG. 8 is a diagram showing a state in which the temporary device model 560 is inserted in the driver model 510 in the circuit model 500, and which is different from that shown in FIG. 7.

In the state shown in FIG. 8, the temporary device model 560 inserted in the driver model 510 is placed between the die model 511 and the package model 512.

The internal portion of the driver model 510 shown in FIG. 7 or 8 described above as a place in which the temporary device model 560 is inserted corresponds to an example of the application position in accordance with the present invention.

A further description will be made by referring again to FIG. 5.

After the processing in step S104 shown in FIG. 5 has been completed, transient analysis is executed on the circuit model 500 in which the temporary device model 560 is inserted (step S105).

In transient analysis of step S105, the state of the circuit model 500 is promptly changed into a steady state by the static stable potential output as an initial potential from the temporary device model 560 as described above, and a simulation in the steady state is executed.

Figure 9:
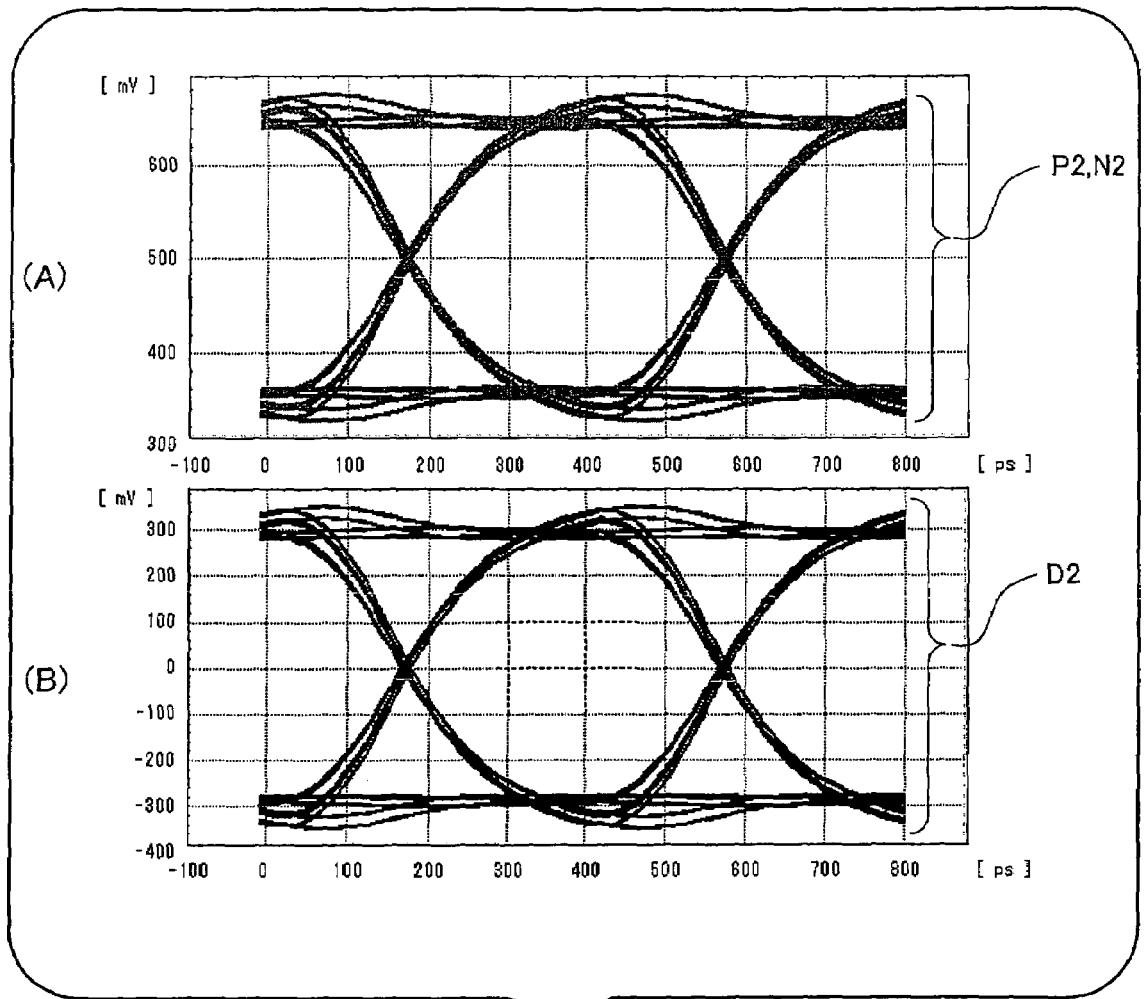
FIG. 9 is a diagram showing the results of transient analysis on the circuit model 500 shown in FIG. 6, in which the temporary device model 560 is inserted.

FIG. 9 is a diagram showing the analysis results of transient analysis on the circuit model 500 shown in FIG. 6, in which the temporary device model 560 is inserted.

Part (A) of FIG. 9 is a Waveform showing changes in the potential on the Pos line model 530 and the potential on the Neg line model 540 during signal transmission. Part (B) of FIG. 9 is a Waveform showing changes in the differential potential, i.e., the difference between the potential on the Pos line model 530 and the potential on the Neg line model 540.

At an initial stage of transient analysis of the circuit model 500 in which the temporary device model 560 is inserted, the maximum potential on the Pos line model 530 is substantially equal to that on the Neg line model 540, and the minimum potential on the Pos line model 530 is substantially equal to that on the Neg line model 540, as in signal transmission in the actual transmission circuit in the steady state. Accordingly, line P2 indicating the change in potential on the Pos line model 530 in the circuit model 500 is superposed generally on line N2 indicating the change in potential on the Neg line model 540, as seen in part (A) of FIG. 9. As a result, line D2 indicating the differential potential changes up and down about 0 V, as shown in part (B) of FIG. 9.

Thus, in transient analysis in step S105 shown in FIG. 5, the analysis results matching the actual signal transmission can be obtained in a short time even on the transmission circuit in which a capacitor is used as an AC coupling component.

After the completion of this transient analysis, the process shown in the flowchart of FIG. 5 ends.

In the circuit simulator 400 in this embodiment, as described above, a simulation of even a transmission circuit in which a capacitor is used as an AC coupling component can be performed in a short time since transient analysis on the transmission circuit is executed after promptly changing the state of the circuit model of the transmission circuit into a steady state. The stable potential for changing the state of the circuit model into a steady state is analytically computed by DC analysis in which potentials in the circuit model 500 are computed on the assumption that the transmission circuit is statically stable. Therefore, even an inexperienced person can easily perform the simulation of signal transmission, and a shorter simulation time suffices for the simulation even if the time for such DC analysis is included. That is, the circuit simulator 400 in this embodiment is capable of easily executing a simulation while limiting the analysis time.

A transmission circuit which transmits a differential signal has been described as an example of the transmission circuit to be analyzed with the circuit simulator of the present invention. However, the present invention is not limited to analysis of such a transmission circuit. For example, a circuit in which a signal is transmitted over a single line may be analyzed by the circuit simulator of the present invention.

Also, while the transmission circuit described as an example of the transmission circuit to be analyzed with the circuit simulator of the present invention is a transmission circuit in one system, the present invention is not limited to analysis of such a transmission circuit. According to the present invention, a network circuit or the like formed of transmission circuits in plural systems may be analyzed. In the case of simulating such a network circuit, a simulation of the transmission circuit in each system is individually executed.

What is claimed is:

1. A circuit simulator which performs a simulation of a transmission circuit in which a driver circuit which transmits a signal and a receiver circuit which receives the signal are coupled to each other by a line, the circuit simulator comprising:
    a DC analysis section to analyze a static stable potential in the line based on an assumption that a static potential is applied to each position on the transmission circuit and is stable, once an AC coupling component which blocks a DC current that heads for the receiver circuit from the driver circuit while allowing an AC current to pass therethrough is connected in the line, the static stable potential being at the receiver circuit side in the line;
    an initial potential application section to apply, as an initial potential in the simulation, the stable potential obtained by the DC analysis section to an application position on the driver circuit side from the AC coupling component in a flow of the signal through the transmission circuit; and
    a simulation section to perform the simulation of the transmission circuit under the initial potential applied by the initial potential application section wherein the circuit simulator is executed by a computer.

2. The circuit simulator according to claim 1, wherein the initial potential application section to apply the initial potential to the application position by inserting at the application position a device model which first outputs the initial potential, and which thereafter behaves as a simple conductor.

3. The circuit simulator according to claim 1, wherein the initial potential application section to apply the initial potential to a predetermined position on the line set as the application position.

4. The circuit simulator according to claim 1, wherein the initial potential application section to apply the initial potential to a position in the driver circuit set as the application position.

5. A simulation program storage medium that stores a circuit simulation program which is incorporated in a computer, and which enables the computer to operate as a circuit simulator performing a simulation of a transmission circuit, where a driver circuit that transmits a signal and a receiver circuit that receives the signal are coupled to each other by a line, the circuit simulation program implementing:
    a DC analysis section to analyze a static stable potential in the line based on an assumption that a static potential is applied to each position on the transmission circuit and is stable, once an AC coupling component which blocks a DC current that heads for the receiver circuit from the driver circuit while allowing an AC current to pass therethrough is connected in the line, the static stable potential being at the receiver circuit side in the line;
    an initial potential application section to apply, as an initial potential in the simulation, the stable potential obtained by the DC analysis section to an application position on the upstream side of the AC coupling component in a flow of the signal through the transmission circuit; and
    a simulation section to perform the simulation of the transmission circuit under the initial potential applied by the initial potential application section.

6. A circuit simulator which performs a simulation of a transmission circuit in which a driver circuit which transmits a signal and a receiver circuit which receives the signal are coupled to each other by a line, the circuit simulator comprising:
    a DC analysis section to analyze a static stable potential in the line based on an assumption that a static potential is applied to each position on the transmission circuit and is stable, once an AC coupling component which blocks a DC current while allowing an AC current to pass therethrough is connected in the line;
    an initial potential application section to apply, as an initial potential in the simulation, the stable potential obtained by the DC analysis section to an application position on the driver circuit side from the AC coupling component in a flow of the signal through the transmission circuit; and
    a simulation section to perform the simulation of the transmission circuit under the initial potential applied by the initial potential application section;
    wherein the initial potential application section to apply the initial potential to the application position by inserting at the application position a device model which first outputs the initial potential, and which thereafter behaves as a simple conductor wherein the circuit simulator is executed by a computer.

* * * * *